United States Patent
Finders et al.

(10) Patent No.: US 7,425,397 B2
(45) Date of Patent: Sep. 16, 2008

(54) METHOD OF DETERMINING AN ILLUMINATION PROFILE AND DEVICE MANUFACTURING METHOD

(75) Inventors: Jozef Maria Finders, Veldhoven (NL); Armand Eugene Albert Koolen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 543 days.

(21) Appl. No.: 11/223,154

(22) Filed: Sep. 12, 2005

(65) Prior Publication Data

US 2007/0059614 A1 Mar. 15, 2007

(51) Int. Cl.
*G03C 5/00* (2006.01)

(52) U.S. Cl. .......................................... 430/30; 430/311

(58) Field of Classification Search ............ 430/30, 430/311
See application file for complete search history.

(56) References Cited

U.S. PATENT DOCUMENTS

2001/0026448 A1 10/2001 Koizumi et al. ............. 362/268

*Primary Examiner*—Christopher G Young
(74) *Attorney, Agent, or Firm*—Pillsbury Winthrop Shaw Pittman, LLP

(57) ABSTRACT

An illumination profile useable in a lithographic apparatus to match the output of a target lithographic apparatus is obtained by obtaining a reference CD vs. pitch function for the lithographic projection apparatus at at least a plurality of pitch values using a reference illumination profile; obtaining a target CD vs. pitch function at at least the plurality of pitch values; generating a CD sensitivity map for the lithographic projection apparatus for a given pattern; calculating from the reference CD vs. pitch function, the target CD vs. pitch function and the CD sensitivity map, a suitable illumination profile to be used in said lithographic apparatus to expose said given pattern.

18 Claims, 4 Drawing Sheets

METHOD OF DETERMINING AN ILLUMINATION PROFILE AND DEVICE MANUFACTURING METHOD

FIELD

The present invention relates to a device manufacturing method using lithographic apparatus, and in particular to a method of determining an illumination profile to be used in such a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Many semiconductor fabrication plants, known as "fabs", use a variety of different lithographic apparatus. The operators of such a fab will often desire to be able to print the same pattern using two different apparatus and obtain consistent results. Where the different apparatus are the same or similar models, straightforward calibration processes to a common reference can match the apparatus sufficiently closely to enable consistent results. However, where the apparatus are different models, or made by different manufacturers, such matching is difficult and may require many trial exposures for each pattern.

The most important parameter of an exposure that must be matched between different apparatus is the critical dimension (CD) as a function of pitch. Since a given pattern may include areas of several different pitches, it is necessary to ensure that each apparatus prints the same CD over a range of pitches, rather than just at a single pitch value. Conventionally, the coherence of the illumination of the mask has been adjusted to attempt to match CD vs. pitch functions for two different apparatus but this often does not provide a sufficiently close match.

SUMMARY

It is desirable to provide a quick and effective method of matching two different apparatus so that they can be used to print consistent results from the same pattern. According to an aspect of the invention, there is provided a method of determining an illumination profile to be used in a device manufacturing method using a lithographic projection apparatus, the method including obtaining a reference CD vs. pitch function for the lithographic projection apparatus at at least a plurality of pitch values using a reference illumination profile, obtaining a target CD vs. pitch function at at least the plurality of pitch values, generating a CD sensitivity map for the lithographic projection apparatus for a given pattern, calculating from the reference CD vs. pitch function, the target CD vs. pitch function and the CD sensitivity map, a suitable illumination profile to be used in said lithographic apparatus to expose said given pattern.

According to an aspect of the invention, there is provided a device manufacturing method using a lithographic projection apparatus, the method including obtaining a reference CD vs. pitch function for the lithographic projection apparatus at at least a plurality of pitch values using a reference illumination profile, obtaining a target CD vs. pitch function at at least the plurality of pitch values, generating a CD sensitivity map for the lithographic projection apparatus for a given pattern, calculating from the reference CD vs. pitch function, the target CD vs. pitch function and the CD sensitivity map, a suitable illumination profile, illuminating the given pattern using the suitable illumination profile, and projecting an image of the given pattern onto a substrate using the lithographic apparatus.

According to an aspect of the invention, there is provided a device manufacturing method using first and second lithographic apparatus to transfer a given pattern onto first and second substrates, the method comprising, obtaining a target CD vs. pitch function for the first lithographic projection apparatus using a first illumination profile at at least the plurality of pitch values, obtaining a reference CD vs. pitch function for the second lithographic projection apparatus at at least a plurality of pitch values using a reference illumination profile, generating a CD sensitivity map for the second lithographic projection apparatus for the given pattern, calculating from the reference CD vs. pitch function, the target CD vs. pitch function and the CD sensitivity map, a second illumination profile, illuminating the given pattern in the first lithographic apparatus using the first illumination profile, projecting an image of the given pattern onto a first substrate using the first lithographic apparatus, illuminating the given pattern in the second lithographic apparatus using the second illumination profile, and projecting an image of the given pattern onto a second substrate using the second lithographic apparatus.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
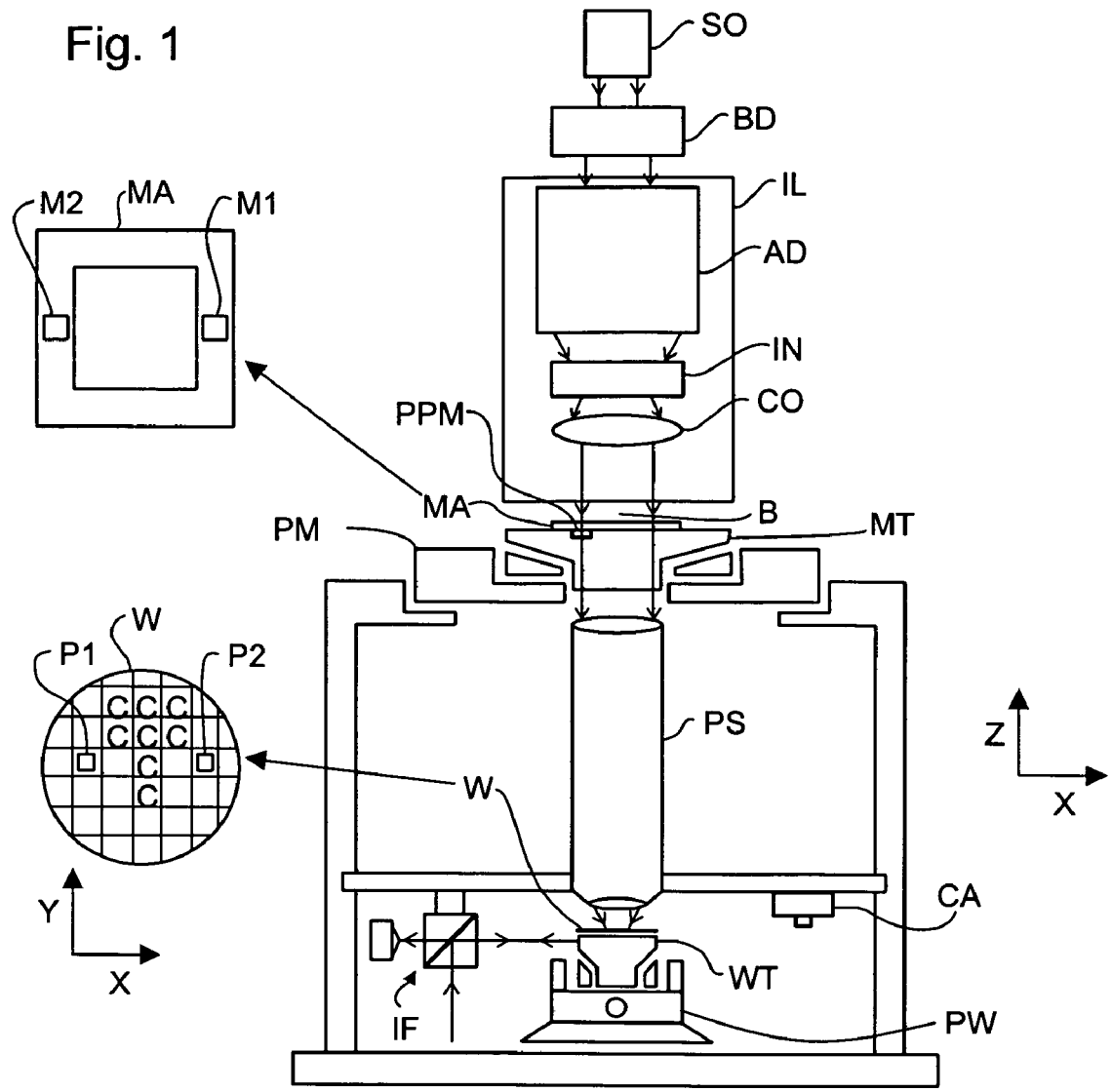
FIG. 1 depicts a lithographic apparatus usable in an embodiment of the invention.

FIG. 1 schematically depicts a lithographic apparatus used in one embodiment of the invention. The apparatus comprises:

an illumination system (illuminator) IL configured to condition a radiation beam B (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
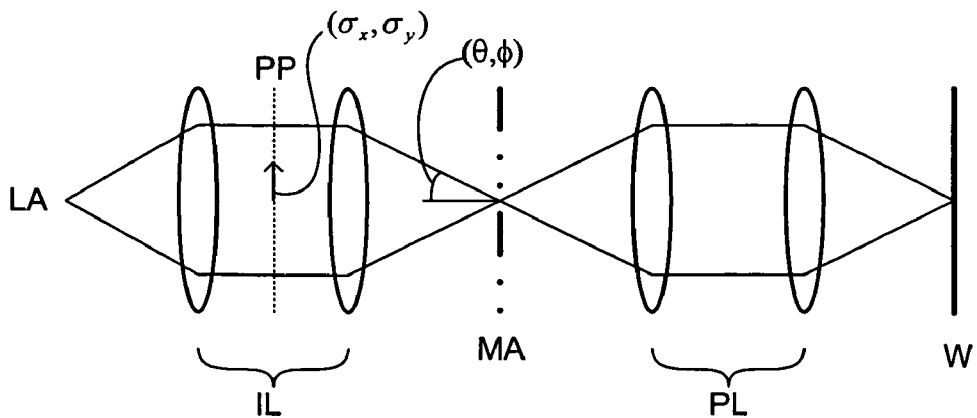
FIG. 2 depicts Kohler illumination.

The lithographic apparatus may use the well-known Kohler illumination arrangement, which is illustrated schematically in FIG. 2. In such an arrangement, there is a plane, referred to as a pupil plane PP, (and sometimes multiple planes) in the illumination system IL that is a Fourier conjugate of the object plane of the projection system PL, in which the mask MA is located. As is well known, position in the pupil plane (expressed using normalized variables $\sigma_x$ and $\sigma_y$) translates to angle ($\theta$, $\phi$) at the object plane so that the angular distribution of the illumination of the mask can be determined by defining an intensity distribution in the pupil plane. A variety of devices can be used to define the intensity distribution in the pupil plane, including zoom lenses, axicons, zoom-axicons, diffractive optical elements, masking blades and aperture plates.

Illumination profiles are commonly referred to by the shape of the intensity distribution in the pupil plane and include: conventional illumination (defined by a pupil filling factor often referred to as a $\sigma$-setting), annular illumination (defined by inner and outer radii, often referred to as $\sigma_i$ and $\sigma_o$), dipole illumination and quadrupole illumination as well as combinations of these and more complex distributions. A lithographic apparatus may be provided with devices to define standard illumination profiles, with or without adjustable parameters, that are suitable for imaging common patterns, or devices to define custom illumination profiles for specific patterns. The present invention may be used with any lithographic apparatus having one or more devices to control or adjust the illumination profile.

In a fab having several different types or models of lithographic projection apparatus it is often desirable to image a given pattern using different apparatus but still obtain consistent results. This requires the imaging performance of one apparatus, referred to below as the second apparatus to be matched to another, referred to as the target apparatus. Generally, the more adaptable apparatus will be adjusted to match the performance of the less adjustable apparatus.

Figure 7:
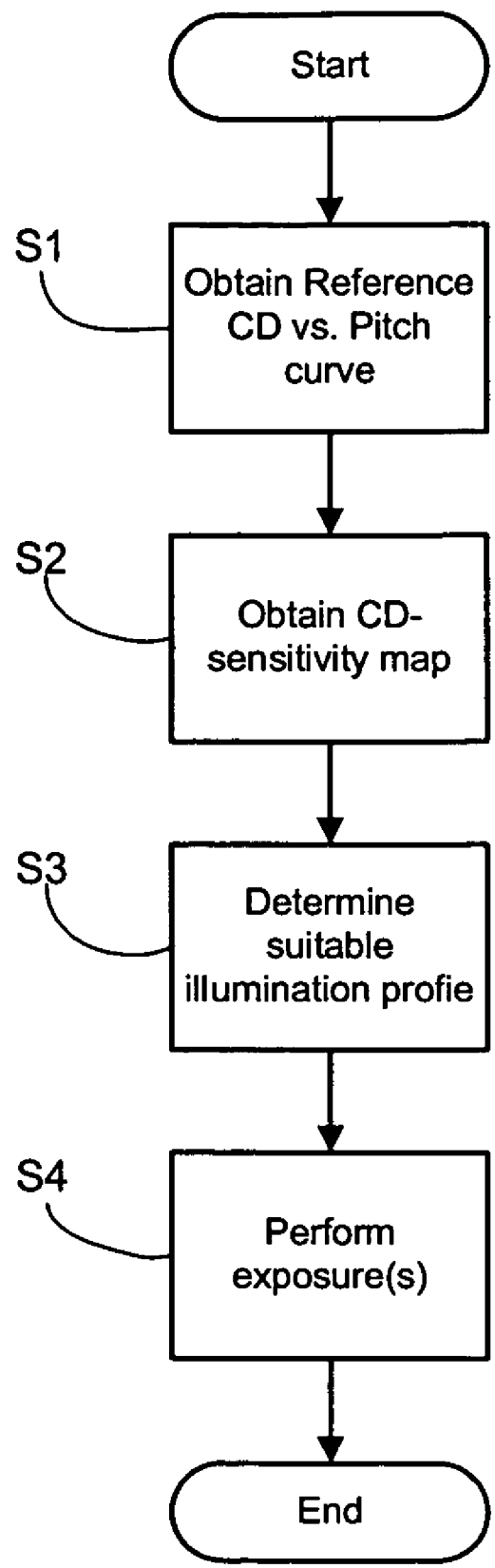
FIG. 7 is a flow chart of a method according to an embodiment of the invention.

Often, the most important imaging metric to be matched is the CD vs. pitch function of the two apparatus and the most easily adjustable parameter is the illumination profile of the second apparatus. In this case, the matching task becomes one of finding an illumination profile that, in the second apparatus, provides a CD vs. pitch function as close as possible to a given target CD vs. pitch function. In an embodiment of the invention, the following method, which is illustrated in FIG. 7, is applied to do this.

Figure 3:
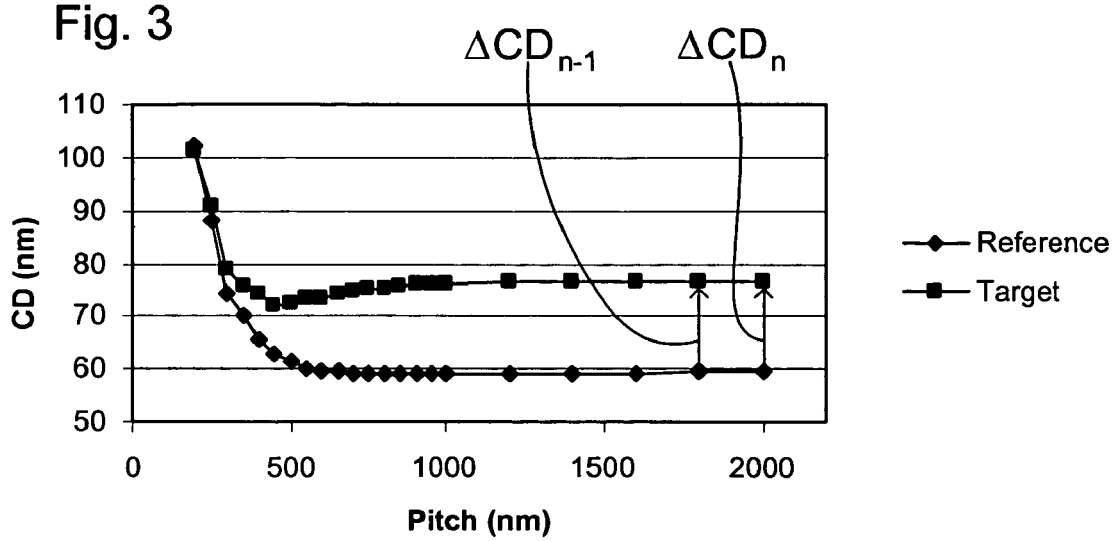
FIG. 3 depicts reference and target CD vs. pitch curves for a lithographic apparatus.
Figure 4:
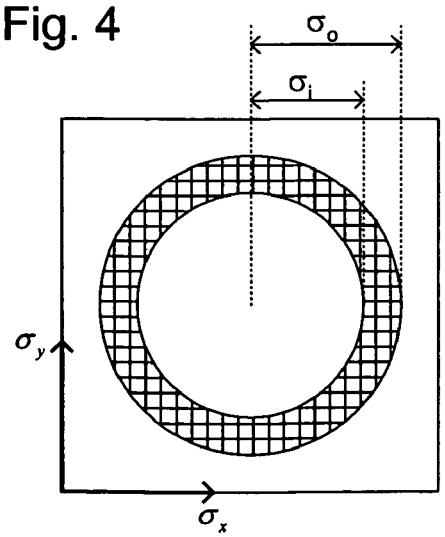
FIG. 4 depicts an annular illumination profile.

First S1, a reference CD vs. pitch function for the second apparatus is obtained using a reference illumination profile. For example, FIG. 3 is a graph showing CD obtained for different pitches in a target (indicated by square data points) apparatus and using the second apparatus (diamond-shaped data points) to act as a reference function. The illumination profile used to obtain the reference function is shown in FIG. 4; it is an annular illumination mode with known $\sigma_i$ and $\sigma_o$ values. If the illumination profile used to obtain the target CD vs. pitch function is known, the reference illumination profile may be chosen to be similar, otherwise, a convenient setting, that allows variation and which images properly for all required pitch values, is chosen. The reference CD vs. pitch function can be obtained by simulation using widely available simulation tools or by exposing a test pattern and measuring the line widths obtained.

The second step S2 is to calculate the CD-sensitivity map for the pupil plane of the second apparatus. The CD-sensitivity map is a function that indicates the change in CD caused by a unit change in intensity at each point in the pupil plane. It is obtained using a specific imaging situation, i.e. a specific pattern and illumination profile, but does not vary significantly for different profiles, within limits, so needs to be calculated only once for each mask and can then be re-used. Well known simulation tools, such as Prolith(™) readily available to those skilled in the art can be used to calculate it.

The next step S3 is to find an illumination profile for the second apparatus that provides a CD vs. pitch function as close as possible of desired to the target CD vs. pitch function. This can be done by minimizing the function:

$$\sum_{j=1}^{n} \left\{ \begin{array}{c} \Delta CD_j - \sum_{\sigma_x} \sum_{\sigma_y} \frac{\partial CD_j}{\partial I(\sigma_x, \sigma_y)} \times \\ [I_{match}(\sigma_x, \sigma_y) - I_{reference}(\sigma_x, \sigma_y)] \end{array} \right\}^2 \quad (1)$$

with respect to $I_{match}(\sigma_x,\sigma_y)$ where $I_{match}(\sigma_x,\sigma_y)$ is the illumination profile to be found, $I_{reference}(\sigma_x,\sigma_y)$ is the reference illumination profile, $$\frac{\partial CD_j}{\partial I(\sigma_x, \sigma_y)}$$

is the CD sensitivity map and $\Delta CD_j$ is the difference between the target and reference CD vs. pitch functions at the $j^{th}$ pitch value. Again, well-known mathematical algorithms, such as a bounded non-linear least squares minimization, effected by readily available tools (e.g. the LSQNONLIN function of Matlab(™) software published by The MathWorks of Natick, Mass. USA) can be used.

In finding the matching illumination profile, additional constraints, representing the capabilities of the second apparatus may be applied, for example, a requirement that the matching illumination profile must be rotationally invariant. If the matching illumination profile is to be obtained using a custom element, e.g. a diffractive optical element, no constraint may be applied.

The criteria for a sufficient match may be set according to the specific circumstances, which may depend, for example, on the criticality of the device layer under consideration. One possible criterion is to set a maximum optical proximity effect deviation ($\Delta OPE$) defined as:

$$\Delta OPE = \sqrt{\frac{1}{n}\sum_{j=1}^{n}(CD_{j,match} - CD_{j,target})^2} \quad (2)$$

Another possibility is simply to accept the best possible match that can be obtained given the imposed constraints.

The obtained illumination profile is then used to print device layers in a known method S4.

Figure 5:
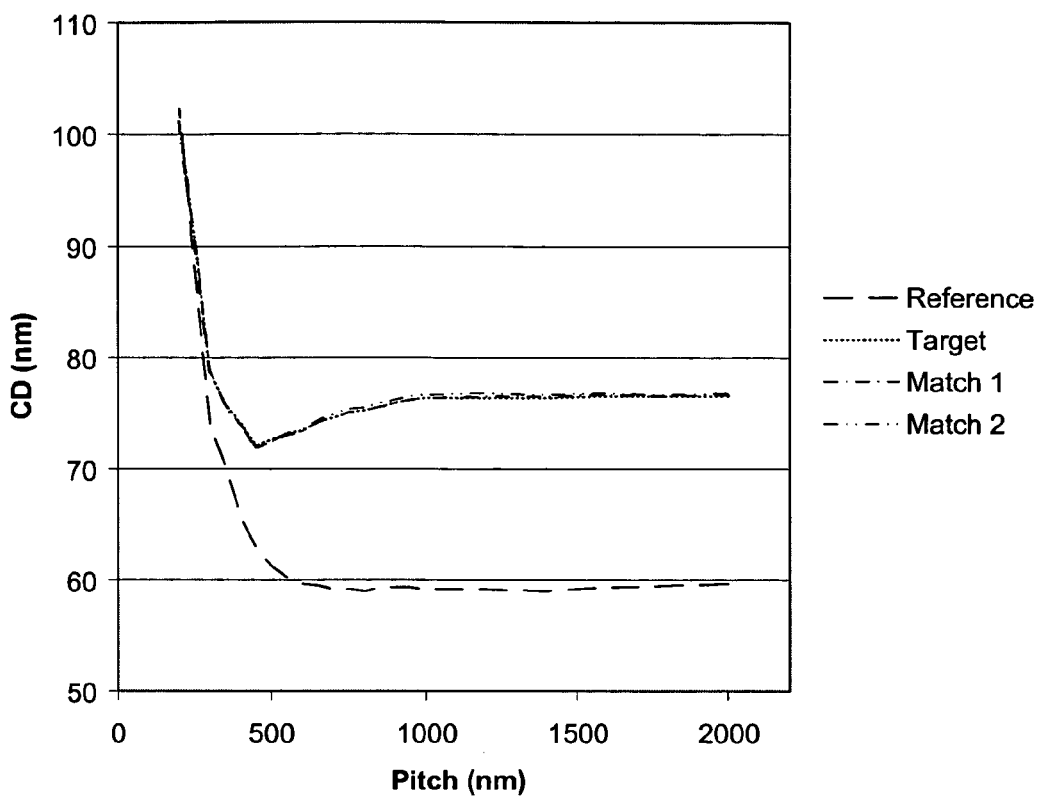
FIG. 5 depicts CD vs. pitch curves obtained in an example of the invention.
Figure 6:
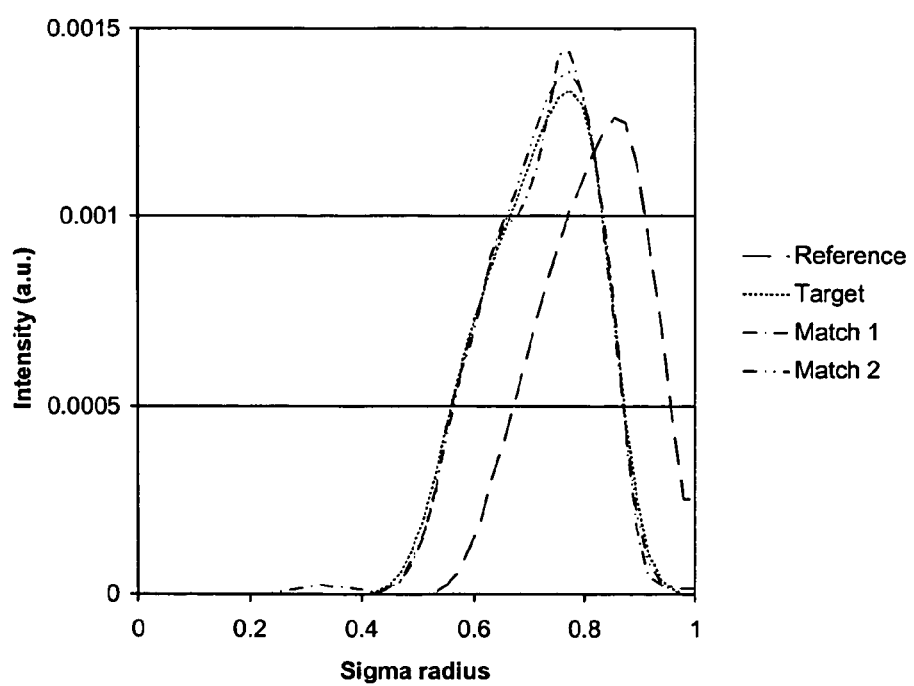
FIG. 6 depicts radial intensity profiles used to obtain the CD vs. pitch curves of FIG. 5.

Example results obtained by carrying out a method according to an embodiment of the present invention are presented in FIGS. 5 and 6. In FIG. 5, CD vs. pitch functions are shown for a reference illumination profile (dashed line), for a target profile (dotted line) and for first and second matching profiles (single and double chain lines). The same line types are used in FIG. 6 to show the radial profiles of the different illumination profiles, all of which are annular profiles.

It will be seen that the reference CD vs. pitch function is quite different than the target, in particular it is much lower, <60 nm, for pitch values greater than 500 nm than the target, which lies between 70 and 80 nm. This is reflected in the radial intensity profiles of the corresponding illumination profiles: the target has a peak between 0.7 and 0.8 whereas that for the reference is greater than 0.8.

The first match was obtained without imposing any additional constraints and provides a CD vs. pitch curve virtually indistinguishable from the target. The radial intensity profile peaks at approximately the same radius as the target profile but has a different shape. A $\Delta OPE$ value of 0.07 nm was obtained. The second match was obtained by imposing an additional constraint that the intensity profile takes a certain shape but still provides a virtually indistinguishable CD vs. pitch function and a similar radial intensity profile. A $\Delta OPE$ value of 0.14 nm was obtained.

It is important to note that although the target illumination profile is shown in FIG. 6, it was not used in obtaining the matching illumination profiles, which can be obtained even when such information is not available.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (ETV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A method of determining an illumination profile to be used in a device manufacturing method using a lithographic projection apparatus, the method comprising:
    obtaining a reference CD vs. pitch function for the lithographic projection apparatus at at least a plurality of pitch values using a reference illumination profile;
    obtaining a target CD vs. pitch function at at least the plurality of pitch values;
    generating a CD sensitivity map for the lithographic projection apparatus for a given pattern;

calculating from the reference CD vs. pitch function, the target CD vs. pitch function and the CD sensitivity map, a suitable illumination profile to be used in the lithographic projection apparatus to expose the given pattern.

2. A method according to claim 1 wherein the CD sensitivity map comprises a set of values of the CD change caused by a unit intensity change for a plurality of points in the pupil plane of an illumination system of the lithographic projection apparatus.

3. A method according to claim 1 wherein the suitable illumination profile is calculated by minimizing the function:

$$\sum_{j=1}^{n} \left\{ \Delta CD_j - \sum_{\sigma_x} \sum_{\sigma_y} \frac{\partial CD_j}{\partial I(\sigma_x, \sigma_y)} \times [I_{match}(\sigma_x, \sigma_y) - I_{reference}(\sigma_x, \sigma_y)] \right\}^2$$

with respect to $I_{match}(\sigma_x,\sigma_y)$, where $I_{match}(\sigma_x,\sigma_y)$ is the suitable illumination profile, $I_{reference}(\sigma_x,\sigma_y)$ is the reference illumination profile, $$\frac{\partial CD_j}{\partial I(\sigma_x, \sigma_y)}$$

is the CD sensitivity map and $\Delta CD_j$ is the difference between the target and reference CD vs. pitch functions at pitch value j of the plurality of pitch values.

4. A method according to claim 3 wherein the minimization is carried out under an additional constraint.

5. A method according to claim 4 wherein the additional constraint is that the suitable illumination profile is rotationally invariant.

6. A method according to claim 3 wherein the minimization is a bounded non-linear least squares minimization.

7. A device manufacturing method using a lithographic projection apparatus, the method comprising:
    obtaining a reference CD vs. pitch function for the lithographic projection apparatus at at least a plurality of pitch values using a reference illumination profile;
    obtaining a target CD vs. pitch function at at least the plurality of pitch values;
    generating a CD sensitivity map for the lithographic projection apparatus for a given pattern;
    calculating from the reference CD vs. pitch function, the target CD vs. pitch function and the CD sensitivity map, a suitable illumination profile;
    illuminating the given pattern using the suitable illumination profile; and
    projecting an image of the given pattern onto a substrate using the lithographic projection apparatus.

8. A method according to claim 7 wherein the CD sensitivity map comprises a set of values of the CD change caused by a unit intensity change for a plurality of points in the pupil plane of an illumination system of the lithographic projection apparatus.

9. A method according to claim 7 wherein the suitable illumination profile is calculated by minimizing the function:

$$\sum_{j=1}^{n} \left\{ \Delta CD_j - \sum_{\sigma_x} \sum_{\sigma_y} \frac{\partial CD_j}{\partial I(\sigma_x, \sigma_y)} \times [I_{match}(\sigma_x, \sigma_y) - I_{reference}(\sigma_x, \sigma_y)] \right\}^2$$

with respect to $I_{match}(\sigma_x,\sigma_y)$, where $I_{match}(\sigma_x,\sigma_y)$ is the suitable illumination profile, $I_{reference}(\sigma_x,\sigma_y)$ is the reference illumination profile, $$\frac{\partial CD_j}{\partial I(\sigma_x, \sigma_y)}$$

is the CD sensitivity map and $\Delta CD_j$ is the difference between the target and reference CD vs. pitch functions at pitch value j of the plurality of pitch values.

10. A method according to claim 9 wherein the minimization step is carried out under an additional constraint.

11. A method according to claim 10 wherein the additional constraint is that the suitable illumination profile is rotationally invariant.

12. A method according to claim 9 wherein the minimization is a bounded non-linear least squares minimization.

13. A device manufacturing method using first and second lithographic projection apparatus to transfer a given pattern onto first and second substrates, the method comprising:
    obtaining a target CD vs. pitch function for the first lithographic projection apparatus using a first illumination profile at at least the plurality of pitch values;
    obtaining a reference CD vs. pitch function for the second lithographic projection apparatus at at least a plurality of pitch values using a reference illumination profile;
    generating a CD sensitivity map for the second lithographic projection apparatus for a given pattern;
    calculating from the reference CD vs. pitch function, the target CD vs. pitch function and the CD sensitivity map, a second illumination profile;
    illuminating the given pattern in the first lithographic projection apparatus using the first illumination profile;
    projecting an image of the given pattern onto a first substrate using the first lithographic projection apparatus;
    illuminating the given pattern in the second lithographic projection apparatus using the second illumination profile; and
    projecting an image of the given pattern onto a second substrate using the second lithographic apparatus.

14. A method according to claim 13 wherein the CD sensitivity map comprises a set of values of the CD change caused by a unit intensity change for a plurality of points in the pupil plane of an illumination system of a lithographic projection apparatus.

15. A method according to claim 13 wherein the second illumination profile is calculated by minimizing the function:

$$\sum_{j=1}^{n} \left\{ \Delta CD_j - \sum_{\sigma_x} \sum_{\sigma_y} \frac{\partial CD_j}{\partial I(\sigma_x, \sigma_y)} \times [I_{match}(\sigma_x, \sigma_y) - I_{reference}(\sigma_x, \sigma_y)] \right\}^2$$

with respect to $I_{match}(\sigma_x,\sigma_y)$, where $I_{match}(\sigma_x,\sigma_y)$ is the second illumination profile, $I_{reference}(\sigma_x,\sigma_y)$ is the reference illumination profile, $$\frac{\partial CD_j}{\partial I(\sigma_x, \sigma_y)}$$

is the CD sensitivity map and $\Delta CD_j$ is the difference between the target and reference CD vs. pitch functions at pitch value j of the plurality of pitch values.

16. A method according to claim 15 wherein the minimization is carried out under an additional constraint.

17. A method according to claim 16 wherein the additional constraint is that the second illumination profile is rotationally invariant.

18. A method according to claim 15 wherein the minimization is a bounded non-linear least squares minimization.

* * * * *

UNITED STATES PATENT AND TRADEMARK OFFICE
CERTIFICATE OF CORRECTION

| | |
|---|---|
| PATENT NO. | : 7,425,397 B2 |
| APPLICATION NO. | : 11/223154 |
| DATED | : September 16, 2008 |
| INVENTOR(S) | : Finders et al. |

It is certified that error appears in the above-identified patent and that said Letters Patent is hereby corrected as shown below:

Column 10, Ln. 20, claim 10, is amended to read:

10. A method according to claim 9 wherein the minimization ~~step~~ is carried out under an additional constraint.

Column 10, claim 13, is amended to read:

13. A device manufacturing method using first and second lithographic projection apparatus to transfer a given pattern onto first and second substrates, the method comprising:

obtaining a target CD vs. pitch function for the first lithographic projection apparatus using a first illumination profile at at least a plurality of pitch values;

obtaining a reference CD vs. pitch function for the second lithographic projection apparatus at at least a plurality of pitch values using a reference illumination profile;

generating a CD sensitivity map for the second lithographic projection apparatus for a given pattern;

calculating from the reference CD vs. pitch function, the target CD vs. pitch function and the CD sensitivity map, a second illumination profile;

illuminating the given pattern in the first lithographic projection apparatus using the first illumination profile;

UNITED STATES PATENT AND TRADEMARK OFFICE
CERTIFICATE OF CORRECTION

PATENT NO.      : 7,425,397 B2
APPLICATION NO. : 11/223154
DATED           : September 16, 2008
INVENTOR(S)     : Finders et al.

It is certified that error appears in the above-identified patent and that said Letters Patent is hereby corrected as shown below:

projecting an image of the given pattern onto a first substrate using the first lithographic projection apparatus;

illuminating the given pattern in the second lithographic projection apparatus using the second illumination profile; and projecting an image of the given pattern onto a second substrate using the second lithographic apparatus.

Signed and Sealed this

Third Day of February, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,425,397 B2
APPLICATION NO. : 11/223154
DATED : September 16, 2008
INVENTOR(S) : Finders et al.

It is certified that error appears in the above-identified patent and that said Letters Patent is hereby corrected as shown below:

Column 10, lines 20-21, claim 10, is amended to read:

10. A method according to claim 9 wherein the minimization ~~step~~ is carried out under an additional constraint.

Column 10, claim 13, lines 27-50, is amended to read:

13. A device manufacturing method using first and second lithographic projection apparatus to transfer a given pattern onto first and second substrates, the method comprising:

obtaining a target CD vs. pitch function for the first lithographic projection apparatus using a first illumination profile at at least a plurality of pitch values;

obtaining a reference CD vs. pitch function for the second lithographic projection apparatus at at least a plurality of pitch values using a reference illumination profile;

generating a CD sensitivity map for the second lithographic projection apparatus for a given pattern;

calculating from the reference CD vs. pitch function, the target CD vs. pitch function and the CD sensitivity map, a second illumination profile;

illuminating the given pattern in the first lithographic projection apparatus using the first illumination profile;

UNITED STATES PATENT AND TRADEMARK OFFICE
CERTIFICATE OF CORRECTION

PATENT NO.         : 7,425,397 B2
APPLICATION NO.    : 11/223154
DATED              : September 16, 2008
INVENTOR(S)        : Finders et al.

It is certified that error appears in the above-identified patent and that said Letters Patent is hereby corrected as shown below:

projecting an image of the given pattern onto a first substrate using the first lithographic projection apparatus;

illuminating the given pattern in the second lithographic projection apparatus using the second illumination profile; and projecting an image of the given pattern onto a second substrate using the second lithographic apparatus.

This certificate supersedes the Certificate of Correction issued February 3, 2009.

Signed and Sealed this

Twenty-fourth Day of February, 2009

JOHN DOLL
*Acting Director of the United States Patent and Trademark Office*